(12) United States Patent
Lee

(10) Patent No.: US 8,772,794 B2
(45) Date of Patent: Jul. 8, 2014

(54) LIGHT EMITTING DEVICE PACKAGE HAVING LED DISPOSED IN LEADFRAME CAVITIES

(75) Inventor: Buemyeon Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 40 days.

(21) Appl. No.: 13/325,326

(22) Filed: Dec. 14, 2011

(65) Prior Publication Data

US 2013/0062632 A1   Mar. 14, 2013

(30) Foreign Application Priority Data

Jul. 29, 2011   (KR) .................. 10-2011-0076250

(51) Int. Cl.
*H01L 29/18* (2006.01)

(52) U.S. Cl.
USPC ........ 257/88; 257/99; 257/166; 257/E33.056; 257/E33.066; 438/25; 438/28; 438/123

(58) Field of Classification Search
None
See application file for complete search history.

(56) References Cited

U.S. PATENT DOCUMENTS

| | | | |
|---|---|---|---|
| 7,690,809 B2 * | 4/2010 | Tsai et al. ................. | 362/147 |
| 7,709,852 B2 * | 5/2010 | Hohn et al. ................ | 257/98 |
| 2005/0104080 A1 * | 5/2005 | Ichihara et al. ............ | 257/98 |
| 2010/0072509 A1 * | 3/2010 | Huang et al. .............. | 257/99 |

* cited by examiner

*Primary Examiner* — Marcos D. Pizarro
*Assistant Examiner* — Cesar Lopez
(74) *Attorney, Agent, or Firm* — Ked & Associates LLP

(57) ABSTRACT

Disclosed are a light emitting device package and a lighting system in which the light emitting device package includes a first cavity in a first region of the body, a second cavity in a second region of the body, first and second lead frames spaced apart from each other in the first cavity, a third lead frame spaced apart from the second lead frame in the second cavity, a first light emitting device on the first and second lead frames in the first cavity, a second light emitting device on the second and third lead frames in the second cavity, and a molding member in the first and second cavities.

19 Claims, 9 Drawing Sheets

LIGHT EMITTING DEVICE PACKAGE HAVING LED DISPOSED IN LEADFRAME CAVITIES

The present application claims priority under 35 U.S.C. §119(a) of Korean Patent Application No. 10-2011-0076250 filed on Jul. 29, 2011, which is hereby incorporated by reference in its entirety.

BACKGROUND

The embodiment relates to a light emitting device package and a lighting system including the same.

Light emitting devices, for example, light emitting diodes (LEDs) are semiconductor devices that convert electric energy into light and extensively used as next-generation light sources in place of conventional fluorescent lamps and glow lamps.

Since the LED generates the light by using the semiconductor device, the LED may represent low power consumption as compared with the glow lamp that generates the light by heating tungsten or the fluorescent lamp that generates the light by urging ultraviolet ray, which is generated through the high-voltage discharge, to collide with a fluorescent substance.

In addition, the LED generates the light by using the potential gap of the semiconductor device, so the LED is advantageous as compared with conventional light sources in terms of life span, response speed, safety and environmental-friendly requirement.

In this regard, various studies have been performed to replace the conventional light sources with the LEDs. The LEDs are increasingly used as light sources for lighting devices, such as various lamps used indoors and outdoors, liquid crystal displays, electric signboards, and street lamps.

SUMMARY

The embodiment provides a light emitting device package including light emitting devices, which are flip-bonded to bottoms of cavities formed at different regions of a body, and a lighting system including the same.

The embodiment provides a light emitting device package, in which a plurality of lead frames are disposed in a plurality of cavities and light emitting devices are flip-bonded to the lead frames disposed on bottoms of the cavities, and a lighting system including the same.

A light emitting device package according to the embodiment includes a body; a first cavity in a first region of the body; a second cavity in a second region of the body; first and second lead frames spaced apart from each other in the first cavity; a third lead frame spaced apart from the second lead frame in the second cavity; a first light emitting device on the first and second lead frames in the first cavity; a second light emitting device on the second and third lead frames in the second cavity; and a molding member in the first and second cavities.

A light emitting device package according to the embodiment includes a body; a first cavity in a first region of the body; a second cavity in a second region of the body; first and second lead frames on a bottom surface of the first cavity; third and fourth lead frames on a bottom surface of the second cavity; a first light emitting device flip-bonded to the first and second lead frames in the first cavity; a second light emitting device flip-bonded to the third and fourth lead frames in the second cavity; and a molding member in the first and second cavities.

A lighting system according to the embodiment includes a plurality of light emitting device packages; and a module substrate where the light emitting device packages are arrayed. Each light emitting device package includes a body; a first cavity in a first region of the body; a second cavity in a second region of the body; first and second lead frames on a bottom surface of the first cavity; third and fourth lead frames on a bottom surface of the second cavity; a first light emitting device flip-bonded to the first and second lead frames in the first cavity; a second light emitting device flip-bonded to the third and fourth lead frames in the second cavity; and a molding member in the first and second cavities.

DETAILED DESCRIPTION OF THE EMBODIMENTS

Figure 1:
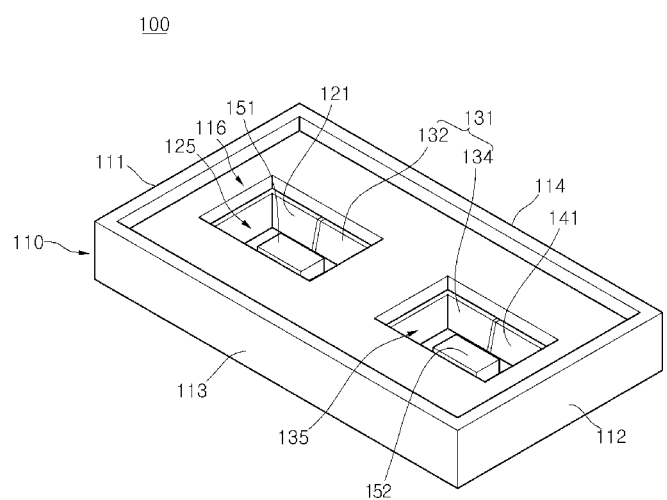
FIG. 1 is a perspective view showing a light emitting device package according to the embodiment.

Hereinafter, the embodiments will be described with reference to accompanying drawings in detail so that those skilled in the art to which the invention pertains can easily realize the embodiments. In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size. The same reference numerals will be assigned to the same elements throughout the drawings. Hereinafter, a light emitting device package according to the embodiment will be described with reference to accompanying drawings.

Figure 2:
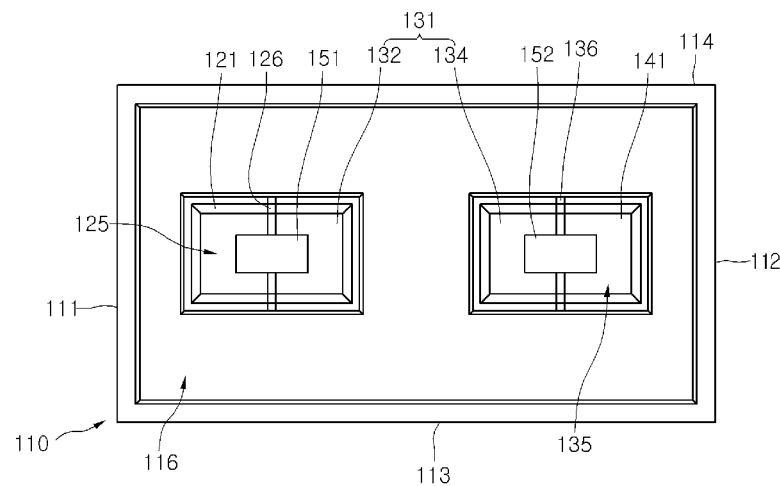
FIG. 2 is a plan view of a light emitting device package shown in FIG. 1.
Figure 3:
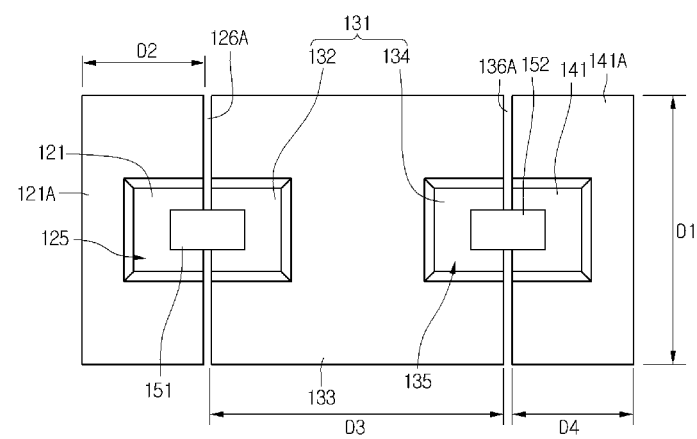
FIG. 3 is a plan view showing a light emitting device connected to a lead frame of a light emitting device package shown in FIG. 1.
Figure 4:
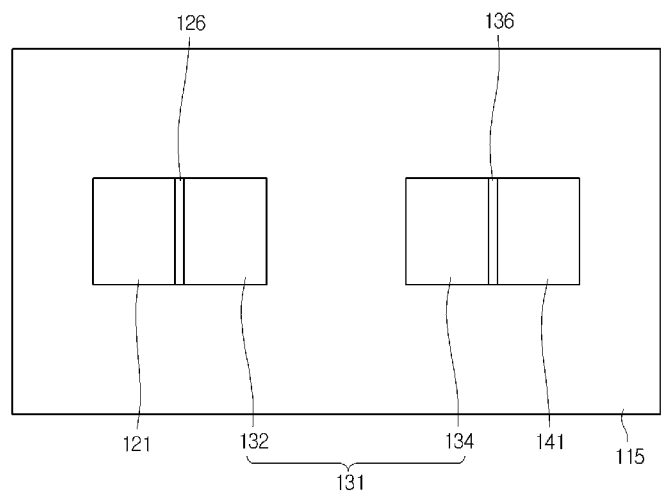
FIG. 4 is a lower view showing a light emitting device package of FIG. 1.
Figure 5:
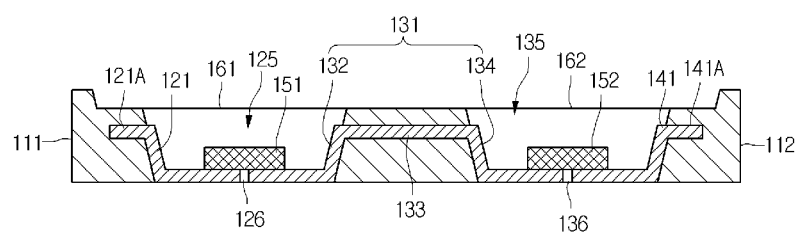
FIG. 5 is a side sectional view showing a light emitting device package of FIG. 1.

FIG. 1 is a perspective view showing a light emitting device package according to the embodiment, FIG. 2 is a plan view of the light emitting device package shown in FIG. 1, FIG. 3 is a plan view showing a light emitting device connected to a lead frame of the light emitting device package shown in FIG. 1, FIG. 4 is a lower view showing the light emitting device package of FIG. 1, and FIG. 5 is a side sectional view showing the light emitting device package of FIG. 1.

Referring to FIGS. 1 to 5, the light emitting device package 100 includes a body 110, a first cavity 125 formed at a first region of the body 110, a second cavity 135 formed at a second region of the body 110, a plurality of lead frames having first to third lead frames 121, 131 and 141 disposed in the body 110, and first and second light emitting devices 151 and 152.

The body 110 includes an insulating material or a conductive material. For instance, the body 110 includes at least one of a resin material, such as PPA (Polyphthalamide), a Si-based material, a metallic material, PSG (photosensitive glass), $Al_2O_3$, and PCB. The body 110 may include a resin material having a high reflectivity, such as PPA (Polyphthalamide).

The body 110 can be formed by using a material having electric conductivity. In this case, an insulating layer (not shown) is formed on a surface of the body 110 to prevent the electric short between the body 110 and the first to third lead frames 121, 131 and 141. When viewed from the top, the body 110 may have various external shapes, such as a triangle, a rectangle, a polygon and a circle according to the application and the design of the light emitting device package 100.

The body 110 includes a plurality of lateral sides 111 to 114, in which at least one of the lateral sides 111 to 114 is vertical or inclined to a lower surface of the body 110. The lateral sides 111 to 114 of the body 110 may be vertical or inclined to the lower surface of the body 110 and widths of the first and second lateral sides 111 and 112 may be different from widths of the third and fourth lateral sides 113 and 114. The widths of the first and second lateral sides 111 and 112 may correspond to the distance between the third and fourth lateral sides 113 and 114 and the widths of the third and fourth lateral sides 113 and 114 may correspond to the distance between the first and second lateral sides 111 and 112. The body 110 has a polygonal structure, for instance, a hexahedral structure, but the embodiment is not limited thereto.

An upper portion 116 of the body 110 is formed with a first region defined by an upper portion of the first cavity 125 and a second region defined by an upper portion of the second cavity 135 and the light is emitted through the first and second regions.

The first and second cavities 125 and 135 are disposed between a top surface and a lower surface of the body 110.

The first and second cavities 125 and 135 are disposed at different regions in the body 110 and concaved down from the top surface of the body 110 so that the first and second cavities 125 and 135 have the cup shape or the recess shape. Lateral sides of the first cavity 125 are inclined or vertical to the bottom surface of the first cavity 125. Among the lateral sides of the first cavity 125, two opposite lateral sides may be inclined in the same angle or different angles.

The center of the first cavity 125 may be aligned in line with the center of the second cavity 135 in the length direction of the light emitting device package.

As shown in FIGS. 1 and 2, the first lead frame 121 and a first part 132 of the second lead frame 131 are disposed in the first cavity 125 while being spaced apart from each other. The first lead frame 121 and the first part 132 of the second lead frame 131 are disposed on the bottom surface of in the first cavity 125 to serve as a heat dissipation part. A first separation part 126 separates the first lead frame 121 and the first part 132 of the second lead frame 131 disposed on the bottom surface of in the first cavity 125 from each other as shown in FIG. 2. The first lead frame 121 and the first part 132 of the second lead frame 131 may constitute the structure of the first cavity 125. The first separation part 126 is formed on the bottom surface and the lateral sides of the first cavity 125.

The third lead frame 141 and a second part 134 of the second lead frame 131 are disposed in the second cavity 135 while being spaced apart from each other. The third lead frame 141 and the second part 134 of the second lead frame 131 are disposed on the bottom surface of in the second cavity 135 to serve as a heat dissipation part. A second separation part 136 separates third lead frame 141 and the second part 134 of the second lead frame 131 disposed on the bottom surface of in the second cavity 135 from each other as shown in FIG. 2. The third lead frame 141 and the second part 134 of the second lead frame 131 may constitute the structure of the second cavity 135. The second separation part 136 is provided on the bottom surface and the lateral sides of the second cavity 135.

The first and second separation parts 126 and 136 may be formed by using an insulating material. For example, the first and second separation parts 126 and 136 may be formed by using a material the same as that of the body 110, but the embodiment is not limited thereto. The first and second separation parts 126 and 136 may have the same width.

Referring to FIG. 3, the second lead frame 131 is disposed between the first lead frame 121 and the third lead frame 141. The length D2 of the first lead frame 121 may be equal to the length D4 of the third lead frame 141 and shorter than the length D3 of the second lead frame 131. In the following description, the length direction refers to the direction extending through the centers of the first and second cavities 125 and 135 or along the long lateral sides of the light emitting device package. In addition, the width direction refers to the direction extending perpendicularly to the length direction or along the short lateral sides of the light emitting device package.

The first to third lead frames 121, 131 and 141 may have the same width D1.

The thickness of the first to third lead frames 121, 131 and 141 is in the range of about 0.15 mm to about 0.3 mm. Since the first and second lead frames 121 and 131 in the first cavity 125 and the second and third lead frames 131 and 141 in the second cavity 135 are directly connected to the light emitting devices 151 and 152, respectively, the heat dissipation efficiency can be improved. The first to third lead frames 121, 131 and 141 include conductive metallic materials. For instance, the first to third lead frames 121, 131 and 141 may include at least one selected from the group consisting of Ti, Cu, Ni, Au, Cr, Ta, Pt, Sn, Ag, P and an alloy thereof. In addition, the first to third lead frames 121, 131 and 141 can be formed of homogeneous metal layers or heterogeneous metal layers, and the embodiment is not limited thereto.

Referring to FIGS. 3 and 5, upper parts 121A and 141A of the first and third lead frames 121 and 141 are bent outward of the cavities 125 and 135 and disposed between the top surface and the lower surface of the body 110 closely to the top surface of the body 110 than to the lower surface of the body 110. The upper part 121A of the first lead frame 121 is bent toward the first lateral side 111 of the body 110 at the lower portion of the first lateral side 111 of the body 110 and the upper part 141A of the third lead frame 141 is bent toward the second lateral side 112 of the body 110, which is opposite to the first lateral side 111 of the body 110, at the lower portion of the second lateral side 112 of the body 110. In addition, other parts of the first to third lead frames 121, 131 and 141 may be selectively exposed through at least one lateral side of the body 110.

A first separation region 126A provided between the first and second lead frames 121 and 131 may have an interval equal to or different from an interval of a second separation region 136A provided between the second and third lead frames 131 and 141.

The first and second separation regions 126A and 136A may have the length equal to the width D1 of the first to third lead frames 121, 131 and 141.

A connection part 133 of the second lead frame 131 connects the first part 132 of the second lead frame 131 to the second part 134 of the second lead frame 131. As shown in FIG. 5, the connection part 133 may be disposed in the body 110 or exposed on the top surface of the body 110.

Referring to FIGS. 4 and 5, the bottom surface of the first cavity 125 is aligned on the same plane with the lower surface 115 of the body 110. At the bottom surface of the first cavity 125, the first lead frame 121 is spaced apart from the first part 132 of the second lead frame 131 by the first separation part 126. The bottom surface of the second cavity 135 is aligned on the same plane with the lower surface 115 of the body 110. At the bottom surface of the second cavity 135, the second lead frame 131 is spaced apart from the second part 134 of the second lead frame 131 by the second separation part 136.

At least one first light emitting device 151 is disposed in the first cavity 125 and the first light emitting device 151 is bonded to the bottom surface of the first cavity 125 through the flip scheme. The first light emitting device 151 can be bonded to the first lead frame 121 and the first part 132 of the second lead frame 131 by an adhesive member, such as a solder or a conductive member, without using an additional wire. The first cavity 125 may have the symmetrical structure about the line extending through the center of the first light emitting device 151. In addition, the first cavity 125 may have the point symmetrical structure or the asymmetrical structure.

At least one second light emitting device 152 is disposed in the second cavity 135 and the second light emitting device 152 is bonded to the bottom surface of the second cavity 135. The second light emitting device 152 can be soldered to the third lead frame 141 and the second part 134 of the second lead frame 131 without using an additional wire. The light emitting devices 151 and 152 can be disposed at the centers of the cavities 125 and 135, respectively. The second cavity 135 may have the symmetrical structure about the line extending through the center of the second light emitting device 152. In addition, the second cavity 135 may have the point symmetrical structure or the asymmetrical structure.

Since the first and second light emitting devices 151 and 152 are flip-bonded in the first and second cavities 125 and 135, respectively, a space required for a wire bonding can be omitted in the first and second cavities 125 and 135. In addition, since the first light emitting device 151 is bonded in the first cavity 125 and the second light emitting device 152 is bonded in the second cavity 135, it is not necessary to provide an additional lead frame on the body 110, which is required for the wire bonding. Further, the thickness of the light emitting device package can be more reduced because the wire can be omitted.

The first and second light emitting devices 151 and 152 may selectively emit the light having the wavelength band in the range of the ultraviolet band to the visible band. In addition, the first and second light emitting devices 151 and 152 may emit the lights having the same peak wavelength or the different peak wavelengths. The first and second light emitting devices 151 and 152 may include an LED chip employing group III-V compound semiconductors. For instance, the first and second light emitting devices 151 and 152 may include at least one of a UV (ultraviolet) LED chip, a blue LED chip, a green LED chip, a white LED chip and a red LED chip.

Referring to FIG. 5, a first molding member 161 is formed in the first cavity 125 and a second molding member 162 is formed in the second cavity 135. The first and second molding members 161 and 162 are formed of a transmittive resin layers including silicon or epoxy materials. The first and second molding members 161 and 162 can be formed up to the upper region of the body 110. The first and second molding members 161 and 162 may include phosphors to convert the wavelength of the light emitted from the first and second light emitting devices 151 and 152. The phosphor is excited by a part of the light emitted from the first and second light emitting devices 151 and 152 so that the wavelength of the light can be converted.

For instance, if the first and second light emitting devices 151 and 152 are blue LEDs and the phosphor is a yellow phosphor, the yellow phosphor is excited by the blue light so that the white light may be generated. If the first and second light emitting devices 151 and 152 emit the UV light, red, green and blue phosphors are added to the first and second molding members 161 and 162 to generate the white light. The same type or different types of phosphors may be added to the first and second molding members 161 and 162, and the embodiment is not limited thereto.

Figure 6:
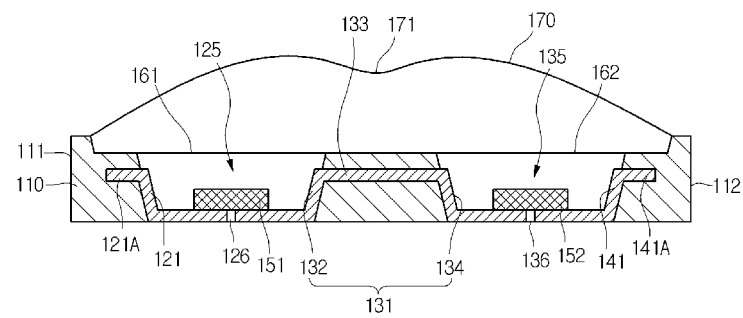
FIG. 6 is a side sectional view showing a light emitting device package of FIG. 1 having a lens according to the embodiment.

As shown in FIG. 6, a lens 170 can be formed on the body 110. The lens may include a concave lens and/or a convex lens and can adjust the distribution of the light emitted from the light emitting device package 100. In addition, the lens may have a concave structure at the center thereof and a convex structure at the regions corresponding to the light emitting devices 151 and 152. In addition, a concave part 171 may be provided at the center of the top surface of the lens 170, but the embodiment is not limited thereto.

Figure 7:
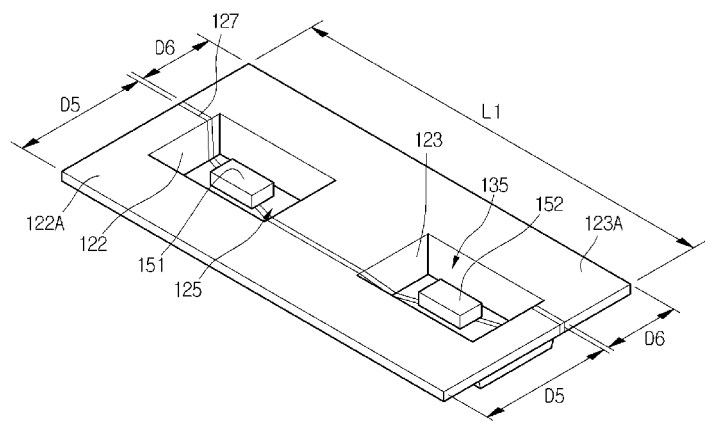
FIG. 7 is a perspective view showing a lead frame of a light emitting device package according to another embodiment.

FIG. 7 is a perspective view showing a lead frame of a light emitting device package according to another embodiment.

Referring to FIG. 7, the light emitting device package includes first and second lead frames 122 and 123 having the same length L1. The first and second lead frames 122 and 123 are spaced apart from each other in the first and second cavities 125 and 135 by a separation part 127. A side width D5 of the first lead frame 122 is wider than a side width D6 of the second lead frame 123. An upper part 122A of the first lead frame 122 and an upper part 123A of the second lead frame 123 are bent in opposition to each other.

The separation part 127 extends lengthwise along the first and second lead frames 122 and 123 by way of the bottom surfaces of the first and second cavities 125 and 135.

Figure 8:
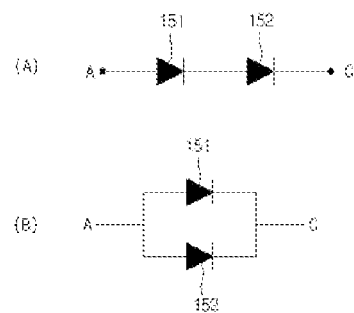
FIG. 8 is a circuit view of a plurality of light emitting devices according to the embodiment.

Referring to FIG. 8, the first and second light emitting devices 151 and 152 of the light emitting device package shown in FIG. 1 are connected to each other in series (see, (A) of FIG. 8), and the first and second light emitting devices 151 and 152 of the light emitting device package shown in FIG. 7 are connected in parallel to each other (see, (B) of FIG. 8). The first and second light emitting devices 151 and 152 supply power to an anode A and a cathode C.

Figure 9:
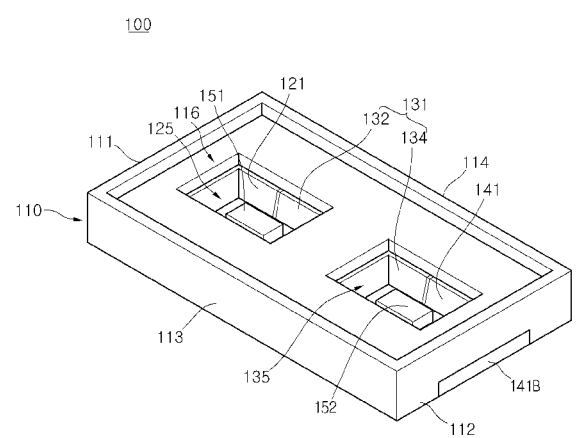
FIG. 9 is a perspective view showing a light emitting device package according to the second embodiment.
Figure 10:
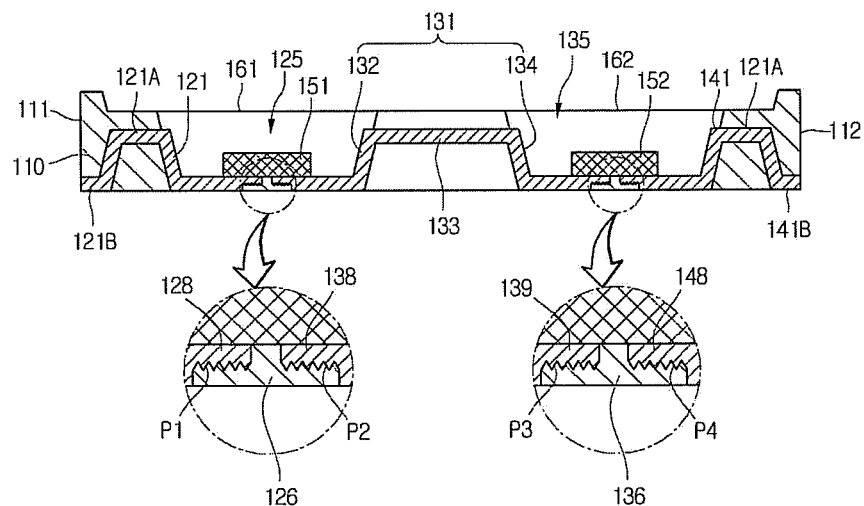
FIG. 10 is a side sectional view of a light emitting device package shown in FIG. 9.

FIG. 9 is a perspective view showing a light emitting device package according to the second embodiment, and FIG. 10 is a side sectional view of a light emitting device package shown in FIG. 9. In the following description about the second embodiment, the elements and structures that have been described in the first embodiment may not be explained in detail in order to avoid redundancy.

Referring to FIG. 9, the light emitting device package 100 includes a body 110, a first cavity 125 formed at a first region of the body 110, a second cavity 135 formed at a second region of the body 110, first and second lead frames 121 and 131 formed in the body 110, and first and second light emitting devices 151 and 152.

The first lead frame 121 includes a first lead part 121B. The first lead part 121B may protrude toward the first lateral side 111 of the body 110 at the lower portion of the first lateral side 111 of the body 110.

The first lead frame 121 includes a second lead part 141B. The second lead part 141B may protrude toward the second lateral side 112 of the body 110 at the lower portion of the second lateral side 112 of the body 110.

Referring to FIG. 10, a lower surface of the first separation part 126 disposed between the first and second lead frames 121 and 131 has a width wider than a width of a top surface of the first separation part 126. Thus, the first and second lead frames 121 and 131 are supported against each other by the first separation part 126.

A lower surface of the second separation part 136 disposed between the second and first lead frames 131 and 121 has a width wider than a width of a top surface of the second separation part 136. Thus, the second and first lead frames 131 and 121 are supported against each other by the second separation part 136. The first and second separation parts 126 and 136 may be formed by using a material equal to a material of the body 110 or by using an adhesive material different from the material of the body 110, but the embodiment is not limited thereto.

A first end 128 of the first lead frame 121 and a first end 138 of the second lead frame 131 may have the step structure. The step structure may increase the contact area with respect to the first separation part 126. In addition, concavo-convex patterns P1 and P2 are formed on the surface of the step structure of the first end 128 of the first lead frame 121 and the first end 138 of the second lead frame 131 to increase the contact area with respect to the first separation part 126, so that the moisture penetration can be suppressed.

A second end 139 of the second lead frame 131 and a first end 148 of the first lead frame 121 may have the step structure. The step structure may increase the contact area with respect to the second separation part 136. In addition, concavo-convex patterns P3 and P4 are formed on the step structure of the second end 139 of the second lead frame 131 and the first end 148 of the first lead frame 121 to increase the contact area with respect to the second separation part 136, so that the moisture penetration can be suppressed.

Figure 11:
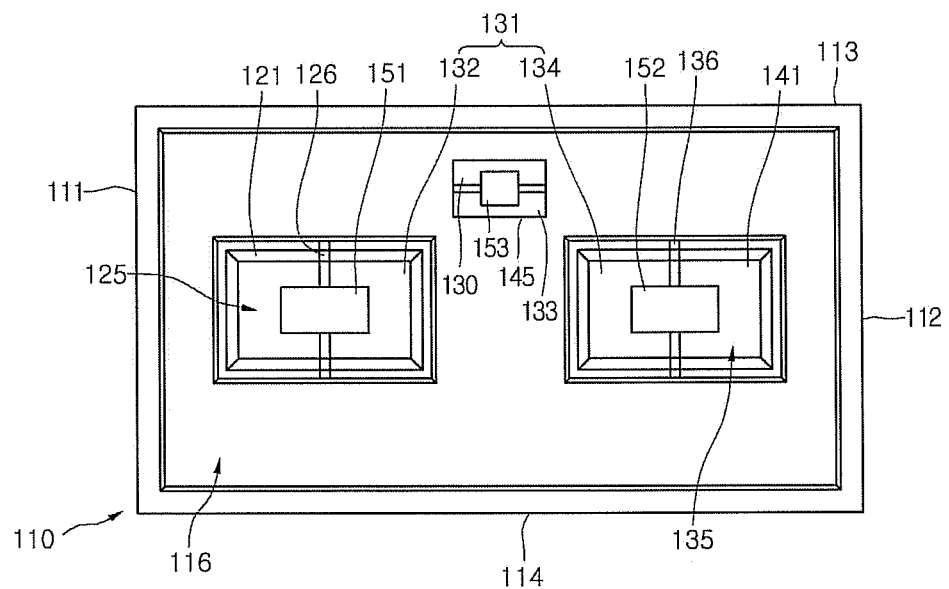
FIG. 11 is a plan view showing a light emitting device package according to the third embodiment.
Figure 12:
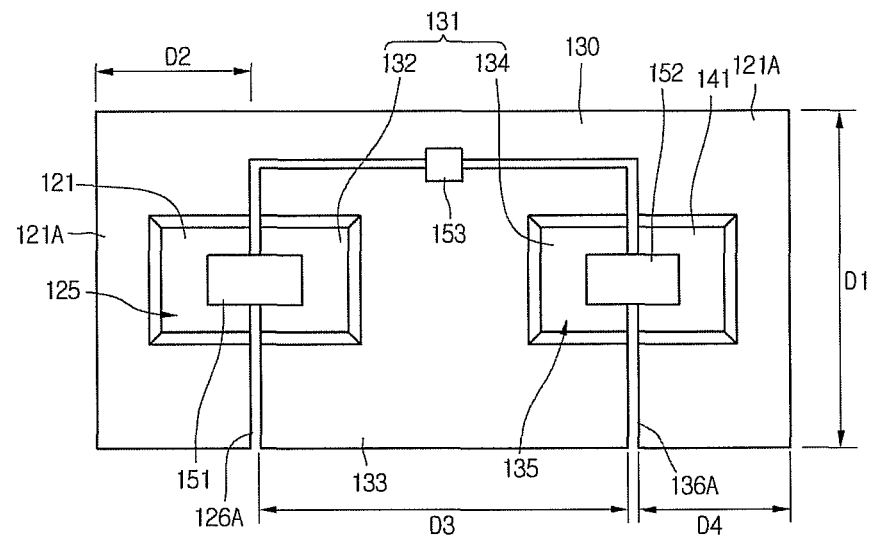
FIG. 12 is a plan view of a light emitting device package shown in FIG. 11, illustrating the arrangement of lead frames, light emitting devices and protective devices.

FIG. 11 is a plan view showing a light emitting device package according to the third embodiment, and FIG. 12 is a plan view of the light emitting device package shown in FIG. 11, illustrating the arrangement of lead frames, light emitting devices and protective devices.

Referring to FIGS. 11 and 12, the light emitting device package includes a body 110, a first cavity 125 formed at a first region of the body 110, a second cavity 135 formed at a second region of the body 110, first and second lead frames 121 and 131 formed in the body 110, and first and second light emitting devices 151 and 152.

The first lead frame 121 is connected to a frame 141 by a connection frame 130. The connection frame 130 is disposed between the second lead frame 131 and a third lateral side 113 of the body 110.

A protective device 153 is disposed between the connection frame 130 and a connection part 133 of the second lead frame 131. The protective device 153 is disposed in a third cavity 145 formed on a top surface of the body 110 with a predetermined depth. The depth of the third cavity 145 is lower than the depth of the first and second cavities 125 and 135. For instance, the depth of the third cavity 145 is in the range of 50 μm to 200 μm.

The protective device 153 may selectively include a Zener diode, a thyristor, or a TVS (transient voltage suppression) diode.

An interval between the first and second separation parts 126 and 136 may be equal to or greater than an interval between the connection frame 130 and the connection part 133 of the second lead frame 131, but the embodiment is not limited thereto.

Molding members including phosphors are disposed in the first and second cavities 125 and 135, and a molding member having no phosphor is disposed in the third cavity 145.

Although the embodiment discloses that the cavities are defined by two or three frames and the light emitting device is flip-bonded in the cavities, the embodiment is not limited thereto. For instance, the light emitting device can be flip-bonded in at least three cavities.

Figure 13:
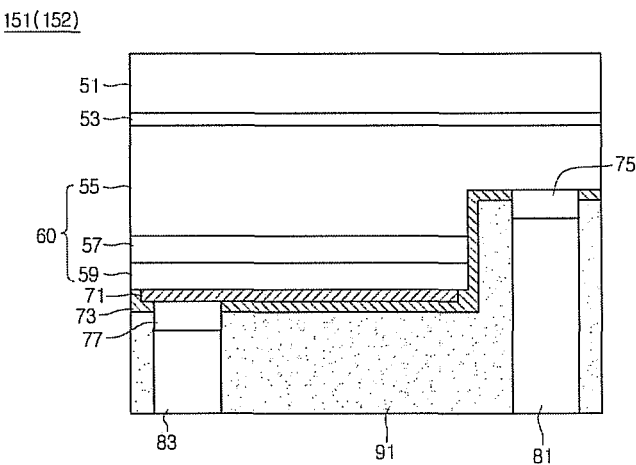
FIG. 13 is a sectional view showing an example of light emitting devices of the light emitting device package according to the embodiment.

FIG. 13 is a sectional view showing an example of light emitting devices of the light emitting device package according to the embodiment.

Referring to FIG. 13, each of the light emitting devices 151 and 152 includes a substrate 51, a first semiconductor layer 53, a first conductive semiconductor layer 55, an active layer 57, a second conductive semiconductor layer 59, a reflective electrode layer 71, an insulating layer 73, a first electrode 75, a second electrode 77, a first connection electrode 81, a second connection electrode 82, and a support member 91.

The substrate 51 may include a transmittive substrate, an insulating substrate or a conductive substrate. For instance, the substrate 51 may include at least one of Al2O3, SiC, Si, GaAs, GaN, ZnO, Si, GaP, InP, Ge and Ga2O3. A light extracting structure, such as a concavo-convex pattern may be formed at one side of the substrate. The concavo-convex pattern can be formed by etching the substrate or an additional pattern, such as a roughness, can be formed. The concavo-convex pattern may have a stripe shape or a convex lens shape. The substrate 51 serves as a growth substrate to grow the semiconductor layer.

The first semiconductor layer 53 may be formed under the substrate 51 by using a group II-VI or III-V compound semiconductor. In detail, the first semiconductor layer 53 may be formed of a single layer or a multiple layer by using the group II-VI or III-V compound semiconductor. For instance, the first semiconductor layer 53 may include a semiconductor layer including the group III-V compound semiconductor, such as GaN, InN, AlN, InGaN, AlGaN, InAlGaN, or AlInN. The first semiconductor layer 53 may be formed by using oxide, such as ZnO, but the embodiment is not limited thereto.

The first semiconductor layer 53 can be formed of a buffer layer. The buffer layer may attenuate the lattice mismatch between the substrate and the nitride semiconductor layer.

The first semiconductor layer 53 can be formed of an undoped semiconductor layer. The undoped semiconductor layer can be formed by using the group III-V compound semiconductor, for instance, a GaN-based semiconductor. The undoped semiconductor layer has a first conductive property even if a conductive dopant is not intentionally doped during the manufacturing process. The undoped semiconductor layer has a concentration lower than that of a conductive dopant of the first conductive semiconductor layer 55.

The first semiconductor layer 53 can be formed of at least one of the buffer layer and the undoped semiconductor layer, but the embodiment is not limited thereto.

The light emitting structure 60 is formed on the first semiconductor layer 53. The light emitting structure 60 may include the group III-V compound semiconductor having the compositional formula of InxAlyGa1-x-yN (0≤x≤1, 0≤y≤1, 0≤x+y≤1) and can emit the light having a predetermined peak wavelength in the range between the ultraviolet wavelength band and the visible wavelength band.

The light emitting structure 60 includes the first conductive semiconductor layer 55, the second conductive semiconductor layer 59, and the active layer 57 interposed between the first conductive semiconductor layer 55 and the second conductive semiconductor layer 59.

The first conductive semiconductor layer 55 is formed under the first semiconductor layer 53. The first conductive semiconductor layer 55 is formed by using the group III-V compound semiconductor doped with a first conductive dopant. The first conductive semiconductor layer 55 is an N type semiconductor layer, and the first conductive dopant includes the N type dopant such as Si, Ge, Se or Te.

A superlattice structure, in which heterogeneous semiconductor layers are alternately stacked, may be disposed between the first conductive semiconductor layer 55 and the first semiconductor layer 53. The superlattice structure can reduce the lattice defect. Each layer of the superlattice structure may have a thickness of about several Å or above.

A first conductive clad layer may be formed between the first conductive semiconductor layer 55 and the active layer 57. The first conductive clad layer may include a GaN-based semiconductor. The bandgap of the first conductive clad layer is equal to or wider than the bandgap of the active layer 57. The first conductive clad layer may confine the carriers.

The active layer 57 is formed under the first conductive semiconductor layer 55. The active layer 57 may selectively include a single quantum well structure, a multiple quantum well (MQW) structure, a quantum dot structure, or a quantum wire structure. The active layer 57 may have a stack structure of well/barrier layers. The well layer may have the compositional formula of InxAlyGa1-x-yN (0≤x≤1, 0≤y≤1, 0≤x+y≤1) and the barrier layer may have the compositional formula of InxAlyGa1-x-yN (0≤x≤1, 0≤y≤1, 0≤x+y≤1).

The stack structure of well/barrier layers may repeat at least one time by using the stack structures of InGaN/GaN, AlGaN/GaN, InGaN/AlGaN, or InGaN/InGaN. The barrier layer may include a semiconductor material having a bandgap wider than that of the well layer.

The second conductive semiconductor layer 59 is formed under the active layer 57. The second conductive semiconductor layer 59 may include a semiconductor doped with a second conductive dopant. For instance, the second conductive semiconductor layer 59 may include at least one of GaN, InN, AlN, InGaN, AlGaN, InAlGaN, and AlInN. The second conductive semiconductor layer 59 is a P type semiconductor layer and the second conductive dopant is a P type dopant, such as Mg, Zn, Ca, Sr or Ba.

The second conductive semiconductor layer 59 may include a superlattice structure such as the InGaN/GaN superlattice structure or the AlGaN/GaN superlattice structure. The superlattice structure of the second conductive semiconductor layer 59 spreads the current, which is abnormally included in the voltage, to protect the active layer 57.

The first conductive semiconductor layer 55 may be formed of the P type semiconductor layer and the second conductive semiconductor layer 59 may be formed of the N type semiconductor layer. In addition, a third conductive semiconductor layer having polarity opposite to that of the second conductive semiconductor layer 59 can be formed on the second conductive semiconductor layer 59.

In the light emitting devices 151 and 152, the first conductive semiconductor layer 55, the active layer 57 and the second conductive semiconductor layer 59 may constitute the light emitting structure 60. The light emitting structure 60 may have one of an N-P junction structure, a P-N junction structure, an N-P-N junction structure, and a P-N-P junction structure. In this case, "N" and "P" represent an N type semiconductor layer and a P type semiconductor, respectively, and "-" represents the structure in which the P type semiconductor layer is directly or indirectly connected to the N type semiconductor layer. The following description will be made on the assumption that the second conductive semiconductor layer 59 serves as the uppermost layer of the light emitting structure for the purpose of convenience of explanation.

The reflective electrode layer 71 is formed under the second conductive semiconductor layer 59. The reflective electrode layer 71 includes at least one of an ohmic contact layer, a reflective layer, a diffusion barrier layer and a protective layer.

The reflective electrode layer 71 may have the structure of the ohmic contact layer/reflective layer/diffusion barrier layer/protective layer, reflective layer/diffusion barrier layer/protective layer, ohmic contact layer/reflective layer/protective layer, reflective layer/diffusion barrier layer, or reflective layer.

The ohmic contact layer makes contact with a lower surface of the second conductive semiconductor layer 59. The contact area between the ohmic contact layer and the second conductive semiconductor layer 59 is equal to or greater than 70% of a lower area of the second conductive semiconductor layer 59. The ohmic contact layer may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), SnO, InO, InZnO, ZnO, IrOx, RuOx, NiO, Ni, Cr, a compound thereof and an alloy thereof. The ohmic contact layer may be formed of at least one layer. The ohmic contact layer may have a thickness of about 1 μm to 1000 μm.

The reflective layer is formed under the ohmic contact layer. The reflective layer may include a material having the reflectivity of 70% or above. For instance, the reflective layer may include one selected from the group consisting of Al, Ag, Ru, Pd, Rh, Pt, Ir and an alloy having at least two of the above elements. The reflective layer can make an ohmic-contact with the lower surface of the second conductive semiconductor layer 59. In this case, the ohmic contact layer can be omitted. The reflective layer may have a thickness of about 1 μm to 10,000 μm.

The protective layer may include one selected from the group consisting of Au, Cu, Hf, Ni, Mo, V, W, Rh, Ru, Pt, Pd, La, Ta, Ti and an alloy having at least two of the above elements. The protective layer may have a thickness of about 1 μm to 10,000 μm.

The reflective electrode layer 71 may have the stack structure of the transmittive electrode layer/reflective layer. The transmittive electrode layer may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), SnO, InO, InZnO, ZnO, IrOx, and RuOx. The reflective layer is formed under the transmittive electrode layer. The reflective layer includes the stack structure, in which at least two pairs of a first layer having a first refractive index and a second layer having a second refractive index are alternately stacked. The first refractive index is different from the second refractive index and the first and second layers may include materials having the refractive index in the range of about 1.5 to 2.4. For instance, the first and second layers may include conductive materials or insulating materials to form the DBR (distributed bragg reflection) structure.

A light extracting structure, such as a roughness, may be formed on at least one of the second conductive semiconductor layer 59 and the reflective electrode layer 71. The light extracting structure may change the critical angle of an incident light, thereby improving the light extraction efficiency.

The first electrode 75 is formed under a region of the first conductive semiconductor layer 55 and the second electrode 77 is formed under a region of the reflective electrode layer 71. The first connection electrode 81 is formed under the first electrode 75 and the second connection electrode 83 is formed under the second electrode 77.

The first electrode 75 is electrically connected to the region of the first conductive semiconductor layer 55. The first electrode 75 may include an electrode pad, but the embodiment is not limited thereto.

The first electrode 75 is spaced apart from the active layer 57 and the lateral side of the second conductive semiconductor layer 59 and has an area smaller than the region of the first conductive semiconductor layer 55.

The second electrode 77 physically and/or electrically makes contact with the second conductive semiconductor layer 59 through the reflective electrode layer 71. The second electrode 77 may include an electrode pad.

Each of the first and second electrodes 75 and 77 may include at least one an adhesive layer, a reflective layer, a diffusion barrier layer and a bonding layer. The adhesive layer makes an ohmic-contact with a lower surface of the region of the first conductive semiconductor layer 55 and includes one selected from the group consisting of Cr, Ti, Co, Ni, V, Hf and an alloy thereof. The adhesive layer may have a thickness of about 1 μm to 1,000 μm. The reflective layer is formed under the adhesive layer and includes one selected from the group consisting of Ag, Al, Ru, Rh, Pt, Pd and an alloy thereof. The reflective layer may have a thickness of about 1 μm to 10,000 μm. The diffusion layer is formed under the reflective layer and includes one selected from the group consisting of Ni, Mo, W, Ru, Pt, Pd, La, Ta, Ti and an alloy thereof. The diffusion layer may have a thickness of about 1 μm to 10,000 μm. The bonding layer is bonded to the first connection electrode 81 and includes one selected from the group consisting of Al, Ru, Rh, Pt and an alloy thereof. The bonding layer may have a thickness of about 1 μm to 10,000 μm.

The first and second electrodes 75 and 77 may have the same stack structure or different stack structures. For instance, the stack structure of the second electrode 77 may be smaller than the stack structure of the first electrode 75. In detail, the first electrode 75 may have the stack structure of the adhesive layer/reflective layer/diffusion barrier layer/bonding layer or the adhesive layer/diffusion barrier layer/bonding layer, and the second electrode 77 may have the stack structure of the adhesive layer/reflective layer/diffusion barrier layer/bonding layer or the adhesive layer/diffusion barrier layer/bonding layer.

An area of a top surface of the second electrode 77 is equal to an area of a lower surface of the reflective electrode layer 71 or larger than an area of a top surface of the second connection electrode 83.

At least one of the first and second electrodes 75 and 77 is provided with a current spreading pattern, such as an arm structure or a finger structure branching from the electrode pad. In addition, the first and second electrodes 75 and 77 may have one electrode pad or plural electrode pads, and the embodiment is not limited thereto.

The first and second connection electrodes 81 and 83 have the lead function to supply power and provide the heat dissipation path. The first and second connection electrodes 81 and 83 have a column shape, such as a spherical column shape, a cylindrical column shape or a polygonal column shape, or a random shape. The polygonal column shape may have the equiangular structure or not, and the embodiment is not limited thereto. Areas of lower surfaces of the first and second connection electrodes 81 and 83 may be equal to or different from areas of top surfaces of the first and second connection electrodes 81 and 83. For instance, the lower surfaces of the first and second connection electrodes 81 and 83 may be smaller or larger than the top surfaces of the first and second connection electrodes 81 and 83.

At least one of the first and second connection electrodes 81 and 83 may have a width smaller than a width of a lower surface of the light emitting structure 60 and wider than a width of a lower surface or a diameter of each of the electrodes 75 and 77.

The first and second connection electrodes 81 and 83 may have a width or a diameter in the range of 1 μm to 100,000 μm and a height in the range of 1 μm to 100,000 μm. In addition, the first connection electrode 81 has a thickness H1 greater than a thickness H2 of the second connection electrode 83 and lower surfaces of the first and second connection electrodes 81 and 83 are aligned on the same plane (that is, horizontal plane).

The first and second connection electrodes 81 and 83 can be formed of a single layer by using one metal or an alloy. In this case, the single layer may have a width and a height in the range of 1 μm to 100,000 μm. In detail, the single layer has a thickness greater than that of the second connection electrode 83.

The first and second connection electrodes 81 and 83 may include one selected from the group consisting of Ag, Al, Au, Cr, Co, Cu, Fe, Hf, In, Mo, Ni, Si, Sn, Ta, Ti, W and an alloy thereof. The first and second connection electrodes 81 and 83 may be plated with one of In, Sn, Ni, Cu and an alloy thereof to improve the adhesive strength with respect to the first and second electrodes 75 and 77. Preferably, the plating thickness in the range of 1 μm to 100,000 μm.

A plating layer may be formed on the first and second connection electrodes 81 and 83. The plating layer can be formed by using Sn, an Sn alloy, Ni, an Ni alloy or Sn—Ag—Cu with the thickness of about 0.5 μm to 10 μm. The plating layer may improve the adhesive strength with respect to other bonding layers.

The insulating layer 73 is formed under the reflective electrode layer 71. The insulating layer 73 can be formed on the lower surface of the second conductive semiconductor layer 59, lateral sides of the second conductive semiconductor layer 59 and the active layer 57, and the lower surface of the region of the first conductive semiconductor layer 55. The insulating layer 73 is formed on the lower portion of the light emitting structure 60 except for the region for the reflective electrode layer 71, the first electrode 75 and the second electrode 77 to electrically protect the lower portion of the light emitting structure 60.

The insulating layer 73 may include an insulating material or an insulating resin including at least one of oxide, nitride, fluoride, and sulfide having at least one of Al, Cr, Si, Ti, Zn, and Zr. For instance, the insulating layer 73 may include one selected from the group consisting of SiO2, Si3N4, Al2O3, and TiO2. In addition, the insulating layer 73 can be formed of a single layer or a multiple layer, but the embodiment is not limited thereto. The insulating layer 73 prevents the electric short between layers of the light emitting structure 60 when the metal structure is formed under the light emitting structure 70 for the purpose of flip bonding.

The insulating layer 73 is not formed on the lower surface of the reflective electrode layer 71, but is formed only on the light emitting structure 60. Since the insulating support member 91 is formed on the lower surface of the reflective electrode layer 71, the insulating layer 73 may not extend to the lower surface of the reflective electrode layer 71.

The insulating layer 73 may have the DBR structure, in which a first layer and a second layer having a refractive index different from that of the first layer are alternately stacked. The first layer may include one of SiO2, Si3N4, Al2O3, and TiO2 and the second layer may include materials except for the materials of the first layer. In this case, the reflective electrode layer can be omitted.

The insulating layer 73 has a thickness in the range of about 100 µm to 10,000 µm. If the insulating layer 73 has the multi-layer structure, each layer may have a thickness in the range of about 1 µm to 50,000 µm or 100 µm to 10,000 µm. The reflective efficiency of the light according to the light emission wavelength may vary depending on the thickness of the each layer of the insulating layer 73 having the multi-layer structure.

The first and second connection electrodes 81 and 83 may include one selected from the group consisting of Ag, Al, Au, Cr, Co, Cu, Fe, Hf, In, Mo, Ni, Si, Sn, Ta, Ti, W and an alloy thereof. In addition, the first and second connection electrodes 81 and 83 may include a plating layer to improve the adhesive strength with respect to the second electrode 77. In this case, the plating layer may include In, Sn, Ni, Cu and an alloy thereof and have a thickness in the range of 1 µm to 100,000 µm. The first and second connection electrodes 81 and 83 can be used as solder balls or a metal bumps, but the embodiment is not limited thereto.

The support member 91 is used as a support layer to support the light emitting devices 151 and 152. The support member 91 is made from an insulating material including resin, such as silicon and epoxy. In addition, the insulating material may include a paste or an insulating ink. The insulating material may include the resin selected from the group consisting of polyacrylate resin, epoxy resin, phenolic resin, polyamides resin, polyimide rein, unsaturated polyesters resin, polyphenylene ether resin (PPE), polyphenylene oxide resin (PPO), polyphenylene sulfides resin, cyanate ester resin, benzocyclobutene (BCB), polyamido-amine (PAMAM) Dendrimers, polypropylene-imine, Dendrimers (PPI), PAMAM-OS (organosilicon) having the PAMAM internal structure and OS external structure, and a combination thereof. The support member 91 may include the material different from the material of the insulating layer 73.

At least one of compounds, such as oxide, nitride, fluoride, and sulfide having at least one of Al, Cr, Si, Ti, Zn, and Zr, can be added to the support member 91. The compound added to the support member 91 may be a thermal diffuser. The thermal diffuser can be formed of a powder grain having a predetermined size, a granule, a filler or an additive, which will be referred to as the thermal diffuser for the purpose of convenience of explanation. The thermal diffuser may have insulating property or conductive property and have a size in the range of 1 µm to 100,000 µm. Preferably, the thermal diffuser has a size in the range of 1,000 µm to 50,000 µm to improve the thermal diffusion efficiency. The thermal diffuser may have a spherical granular shape or a random granular shape, but the embodiment is not limited thereto.

The thermal diffuser may include a ceramic material. The ceramic material includes at least one selected from the group consisting of LTCC (low temperature co-fired ceramic), HTCC (high temperature co-fired ceramic), alumina, quartz, calcium zirconate, forsterite, SiC, graphite, fused silica, mullite, cordierite, zirconia, beryllia, and aluminum nitride. The ceramic material may include metal nitride having the thermal conductivity relatively higher than that of general nitride and oxide. The metal nitride includes a material having the thermal conductivity equal to or higher than 140 W/mK. The ceramic material may include ceramic-based materials, such as SiO2, SixOy, Si3N4, SixNy, SiOxNy, Al2O3, BN, Si3N4, SiC (SiC—BeO), BeO, CeO, and AlN. The thermal conductive material may include C (diamond or CNT) component.

The support member 91 can be formed of a single layer and a multiple layer, and the embodiment is not limited thereto. The support member 91 is provided therein with ceramic powder, so the strength and the thermal conductivity of the support member 91 can be reinforced.

In addition, 1 to 99 wt % of the thermal diffuser may be contained in the support member 91. In detail, 50 to 99 wt % of the thermal diffuser may be contained in the support member 91 to improve the thermal diffusion efficiency. Since the thermal diffuser is contained in the support member 91, the internal thermal conductivity can be more improved. The support member 91 has the thermal expansion coefficient of 4-11 [×106/° C.]. The above thermal expansion coefficient is equal or similar to the thermal expansion coefficient of the substrate 51, such as the sapphire substrate, so the wafer can be prevented from being bent or damaged caused by the difference in the thermal expansion coefficient between the wafer and the light emitting structure 60, thereby preventing the reliability of the light emitting device from being degraded.

An area of the lower surface of the support member 91 is substantially equal to an area of the top surface of the substrate 51. The area of the lower surface of the support member 91 is equal to an area of the top surface of the first conductive semiconductor layer 55. In addition, a width of the lower surface of the support member 91 is equal to a width of the top surface of the substrate 51 and a width of the top surface of the first conductive semiconductor layer 55. Since individual chips are separated after forming the support member 91, the lateral sides of the support member 91, the substrate 51 and the first conductive semiconductor layer 55 can be aligned on the same plane. The lower surface of the support member 91 is flattened, so that the thermal conductivity can be uniformly distributed.

The substrate 51 can be removed. In this case, the first conductive semiconductor layer 55 or the first semiconductor layer 53 of the light emitting structure 60 can be disposed at the uppermost layer of the light emitting structure 60. A top surface of at least one of the substrate 51, the first conductive semiconductor layer 55 and the first semiconductor layer 53, which are disposed at the uppermost layer of the light emitting structure 60, can be formed with a concavo-convex structure.

As shown in FIG. 5, the light emitting devices 151 and 152 are mounted between the first and second lead frames 121 and 131 and between the second and third lead frames 131 and 141, respectively, by means of an adhesive member, such as a solder, or eutectic bonding. The first light emitting device 151 is mounted on the first and second lead frames 121 and 131 provided in the first cavity 125 and the lower portion of the support member 91 formed therein with the thermal diffuser may perform the thermal conductive function through the first and second lead frames 121 and 131.

The second light emitting device 152 is mounted on the second and third lead frames 131 and 141 provided in the second cavity 135 and the lower portion of the support member 91 formed therein with the thermal diffuser may perform the thermal conductive function through the second and third lead frames 131 and 141.

The light emitting devices 151 and 152 transfer heat through the support member 91 and the lead frames 121, 131 and 141, which are different from each other, so the heat dissipation efficiency can be improved.

In addition, the transmittive substrate 51 and the active layer 57 disposed on the light emitting devices 151 and 152 are spaced far from each other, so the light extraction efficiency can be improved.

<Lighting System>

The light emitting device package according to the embodiments may be applied to a lighting system. The light system may have an array structure including a plurality of light emitting device packages. The lighting system may include a display apparatus shown in FIGS. 13 and 14, a light unit shown in FIG. 15, in addition to a lighting lamp, a signal light, a vehicle headlight, an electronic display, etc.

FIG. 13 is a disassembled perspective view of a display apparatus according to an embodiment.

Referring to FIG. 13, the display apparatus 1000 according to the embodiment may include a light guide plate 1041, a light emitting module 1031 supplying light to the light guide plate 1041, a reflective member 1022 under the light guide plate 1041, an optical sheet 1051 on the light guide plate 1041, a display panel 1061 on the optical sheet 1051, and a bottom cover 1011 receiving the light guide plate 1041, the light emitting module 1031, and the reflective member 1022, but the present disclosure is not limited thereto.

The bottom cover 1011, the reflective member 1022, the light guide plate 1041, and the optical sheet 1051 may be defined as a light unit 1050.

The light guide plate 1041 functions to transform linear light to planar light by diffusing the linear light. The light guide plate 1041 may be made of a transparent material, and may include one of acryl-series resin such as polymethyl metaacrylate PMMA), polyethylene terephthlate (PET), poly carbonate (PC), COC, and polyethylene naphthalate resin.

The light emitting module 1031 provides light to at least a side surface of the light guide plate 1041, and finally acts as a light source of a display apparatus.

The light emitting module 1031 may include at least one light emitting module in the bottom cover 1011, and provide light directly or indirectly from one side surface of the light guide plate 1041. The light emitting module 1031 may include a board 1033, and a light emitting device package 100 according to embodiments disclosed above, and the light emitting device packages 100 may be arranged apart by a predetermined interval from each other on the board 1033.

The board 1033 may be a printed circuit board (PCB) including a circuit pattern (not shown). The board 1033 may include a metal core PCB (MCPCB), a flexible PCB (FPCB), etc. as well as the general PCB, but the present disclosure is not limited thereto. In the case where the light emitting device package 100 is mounted on a side surface or a radiant heat plate, the board 1033 may be removed. Herein, some of the radiant heat plate may contact an upper surface of the bottom cover 1011.

The plurality of light emitting device packages 100 may be mounted on the board 1033 such that light emitting surfaces of the plurality of light emitting device packages 100 are spaced apart by a predetermined distance from the light guide plate 1041, but the present disclosure is not limited thereto. The light emitting device package 100 may supply light to a light incident part that is one side surface of the light guide plate 1041, directly or indirectly, but the present disclosure is not limited thereto.

The reflective member 1022 may be provided under the light guide plate 1041. The reflective member 1022 reflects light incident from a lower surface of the light guide plate 1041 to allow the reflected light to be directed toward an upper direction, thereby capable of enhancing brightness of the light unit 1050. The reflective member 1022 may be formed of, for example, PET, PC, PVC resin, or the like, but the present disclosure is not limited thereto.

The bottom cover 1011 may receive the light guide plate 1041, the light emitting module 1031, the reflective member 1022, and the like. For this purpose, the bottom cover 1011 may have a receiving part 1012 formed in a box shape a top surface of which is opened, but the present disclosure is not limited thereto. The bottom cover 1011 may be coupled to a top cover, but the present disclosure is not limited thereto.

The bottom cover 1011 may be formed of a metal material or resin material, and may be manufactured by using a process such as a press molding or an injection molding. Also, the bottom cover 1011 may include metallic or nonmetallic material having a high thermal conductivity, but the present disclosure is not limited thereto.

The display panel 1061 is, for example, an LCD panel, and includes first and second transparent substrates facing each other, and a liquid crystal layer interposed between the first and second substrates. A polarizing plate may be attached on at least one surface of the display panel 1061, but the present disclosure is not limited thereto. The display panel 1061 displays information by using light passing through the optical sheet 1051. The display apparatus 1000 may be applied to a variety of mobile terminals, monitors for notebook computers, monitors for lap-top computers, televisions, etc.

The optical sheet 1051 is disposed between the display panel 1061 and the light guide plate 1041, and includes at least one transparent sheet. The optical sheet 1051 may include, for example, at least one of a diffusion sheet, a horizontal and/or vertical prism sheet, and a brightness reinforcing sheet. The diffusion sheet diffuses incident light, the horizontal and/or vertical prism sheet focuses incident light on a display region, and the brightness reinforcing sheet enhances the brightness by reusing lost light. Also, a protective sheet may be disposed on the display panel 1061, but the present disclosure is not limited thereto. Herein, the display apparatus 1000 may include the light guide plate 1041, and the optical sheet 1051 as optical members positioned on a light path of the light emitting module 1031, but the present disclosure is not limited thereto.

Figure 14:
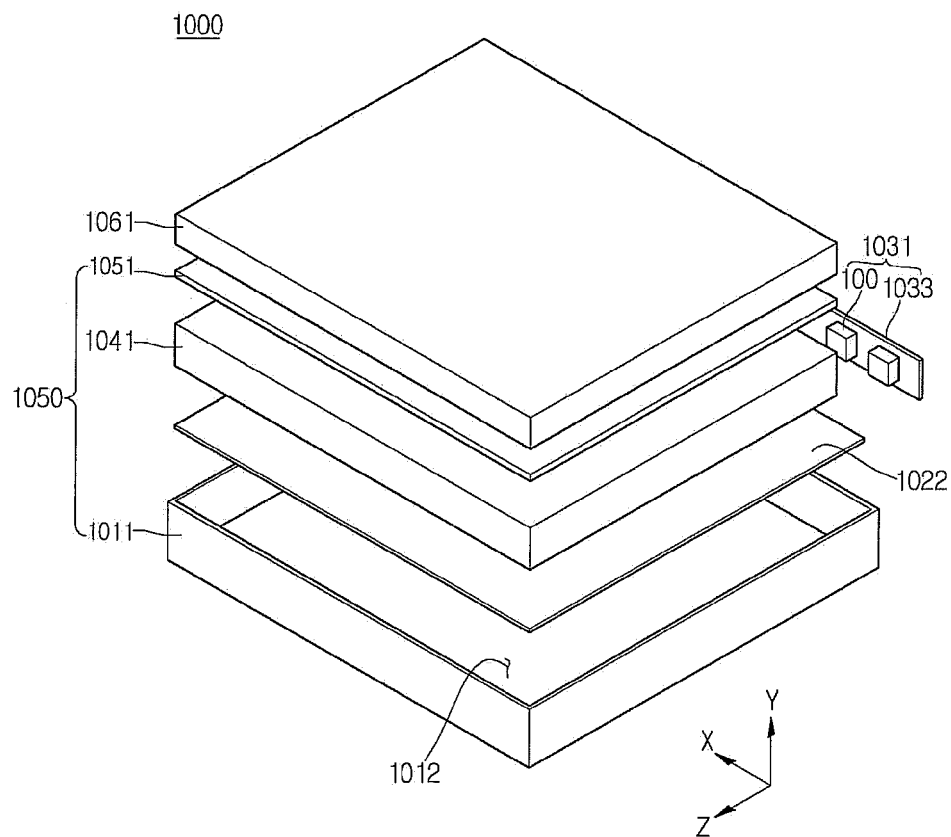
FIG. 14 is a disassembled perspective view of a display apparatus provided with the light emitting device.

FIG. 14 is a cross-sectional view of a display apparatus according to an embodiment.

Referring to FIG. 14, the display apparatus 1100 includes a bottom cover 1152, a board 1120 on which the light emitting device packages 100 disclosed above are arrayed, an optical member 1154, and a display panel 1155.

The board 1120 and the light emitting device package 100 may be defined as a light emitting module 1160. The bottom cover 1152, the at least one light emitting module 1160, and the optical member 154 may be defined as a light unit.

The bottom cover 1152 may be provided with a receiving part, but the present disclosure is not limited thereto.

Herein, the optical member 1154 may include at least one of a lens, a light guide plate, a diffusion sheet, a horizontal and vertical prism sheet, and a brightness reinforcing sheet. The light guide plate may be formed of polycarbonate (PC) or poly methyl methacrylate (PMMA), and may be removed. The diffusion sheet diffuses incident light, the horizontal and vertical prism sheet focuses incident light on a display region, and the brightness reinforcing sheet enhances the brightness by reusing lost light.

The optical member 1154 is disposed on the light emitting module 1160. The optical member 154 transforms light emitted from the light emitting module 1160 to planar light, and performs diffusion, light focusing, and the like.

Figure 15:
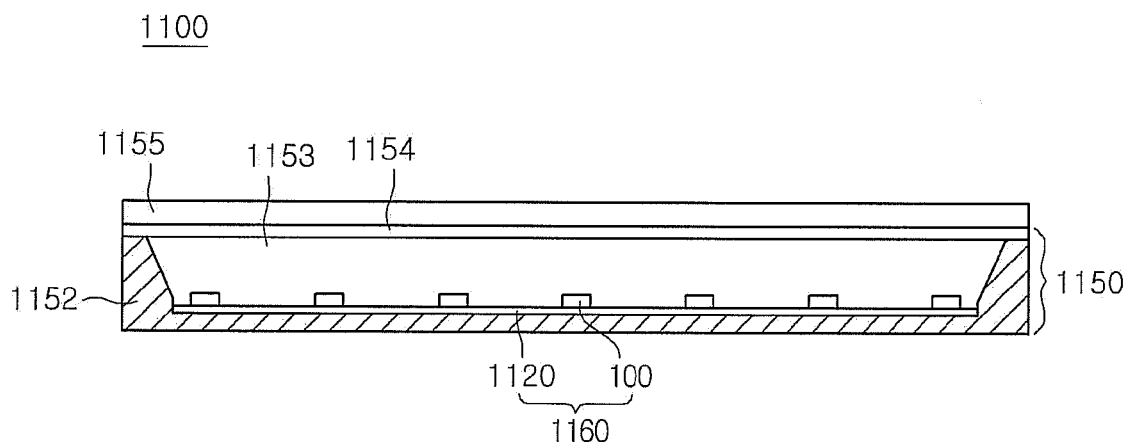
FIG. 15 is a schematic sectional view illustrating another example of a display apparatus provided with the light emitting device.
Figure 16:
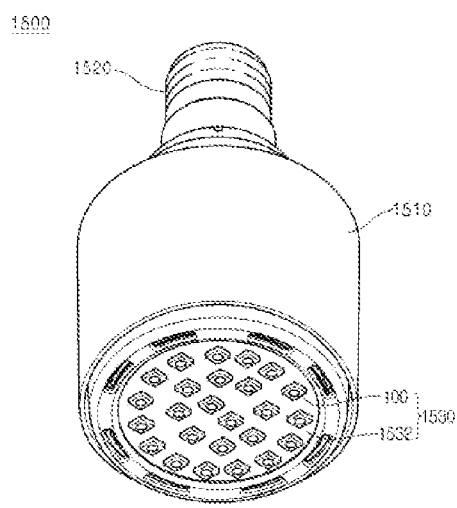
FIG. 16 is a perspective view of a lighting unit provided with the light emitting device.

FIG. 15 is a perspective view of a lighting unit according to an embodiment.

Referring to FIG. 15, the lighting unit 1500 may include a case 1510, a light emitting module 1530 including in the case 1510, and a connection terminal 1520 including in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device package 100 according to the embodiments mounted on the board 1532. The light emitting device package 100 may include a plurality of light emitting device packages which are arrayed apart by a predetermined distance from one another in a matrix configuration.

The board 1532 may be an insulator substrate on which a circuit pattern is printed, and may include, for example, a printed circuit board (PCB), a metal core PCB, a flexible PCB, a ceramic PCB, an FR-4 substrate, etc.

Also, the board 1532 may be formed of a material to efficiently reflect light, and a surface thereof may be formed in a color capable of efficiently reflecting light, for example, white color, or silver color.

The at least one light emitting device packages 100 may be mounted on the board 1532. Each of the light emitting device packages 100 may include at least one light emitting diode (LED) chip. The LED chip may include a color LED emitting red, green, blue or white light, and a UV LED emitting ultraviolet (UV).

The light emitting module 1530 may have a combination of various light emitting device packages so as to obtain desired color and luminance. For example, the light emitting module 1530 may have a combination of a white LED, a red LED, and a green LED so as to obtain a high color rendering index (CRI).

The connection terminal 1520 may be electrically connected to the light emitting module 1530 to supply power. The connection terminal 1520 may be screwed and coupled to an external power in a socket type, but the present disclosure is not limited thereto. For example, the connection terminal 1520 may be made in a pin type and inserted into an external power, or may be connected to the external power through a power line.

According to the embodiment, the light extraction efficiency of the light emitting device package having a plurality of cavities can be improved.

According to the embodiment, the reliability of the light emitting device package and the light unit having the same can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a body;
a first cavity in a first region of the body;
a second cavity in a second region of the body and spaced apart from the first cavity;
first and second lead frames spaced apart from each other under the first region and the second region of the body;
a first light emitting device on the first and second lead frames disposed in the first cavity;
a second light emitting device on the first and second lead frames disposed in the second cavity; and
a molding member in the first and second cavities,
wherein the first lead frame includes a first base part and a first sidewall part extended from the first base part in the first cavity,
wherein the second lead frame includes a second base part and a second sidewall part extended from the second base part in the first cavity,
wherein the first lead frame includes a third base part and a third sidewall part extended from the third base part in the second cavity,
wherein the second lead frame includes a fourth base part and a fourth sidewall part extended from the fourth base part in the second cavity.

2. The light emitting device package of claim 1, further comprising a third cavity formed on the body, wherein a connection frame of the first lead frame and a connection part of the second lead frame are disposed in the third cavity, and a protective device is disposed on the connection frame of the first lead frame and the connection part of the second lead frame in the third cavity.

3. The light emitting device package of claim 1, wherein lower surfaces of the first to fourth base parts are disposed on a same horizontal plane with a lower surface of the body.

4. A lighting system comprising:
a plurality of light emitting device packages; and
a module substrate where the light emitting device packages are arrayed,
wherein each light emitting device package comprises the light emitting device package of claim 1.

5. The light emitting device package of claim 1, wherein each of the first to fourth sidewall parts is formed in plurality.

6. The light emitting device package of claim 1, wherein the first region and the second region are each disposed in an open region recessed at a top surface of the body.

7. The light emitting device package of claim 6, wherein the open region of the body has a width that is wider than a width of each of the first cavity and the second cavity.

8. The light emitting device package of claim 1, wherein each of the first and second light emitting devices comprises:
a light emitting structure; and
first and second electrodes under the light emitting structure,
wherein the first and second electrodes of the first light emitting device are bonded onto the first base part of the first lead frame and the second base part of the second lead frame, and
the first and second electrodes of the second light emitting device are bonded onto the third base part of the first lead frame and the fourth base part of the second lead frame.

9. The light emitting device package of claim 8, wherein each of the first and second light emitting devices comprises a semiconductor layer or a substrate disposed on a top side of the first and second light emitting devices.

10. The light emitting device package of claim 8, wherein each of the first and second light emitting devices comprises:
a reflective electrode layer disposed between the light emitting structure and the second electrode; and
an insulating support member disposed under the reflective electrode layer and disposed around the first and second electrodes,
wherein a lower surface of the insulating support member, a lower surface of the first electrode and a lower surface of the second electrode are disposed on a same plane.

11. The light emitting device package of claim 8, further comprising:
a lead part protruding downward of at least one of lateral sides of the body from at least one of the first and second lead frames.

12. The light emitting device package of claim 8, further comprising:
a first separation part disposed between the first base part of the first lead frame and the second base part of the second lead frame in the first cavity to separate the first and second lead frames; and
a second separation part disposed between the third and fourth base parts of the first and second lead frames in the second cavity to separate the first and second lead frames.

13. The light emitting device package of claim 12, wherein the first separation part is extended between the first sidewall part of the first lead frame and the second sidewall part of the second lead frame, and
the second separation part is extended between the third sidewall part of the first lead frame and the fourth sidewall part of the second lead frame.

14. The light emitting device package of claim 1, wherein the first sidewall part and the third sidewall part of the first lead frame are connected to each other.

15. The light emitting device package of claim 14, wherein the first lead frame further includes a first top part extended from the first and third sidewall parts,
wherein the second lead frame further includes a second top part extended from the second and fourth sidewall parts.

16. The light emitting device package of claim 15, wherein the first and second top parts are disposed between the first cavity and the second cavity.

17. The light emitting device package of claim 15, wherein the first to fourth sidewall parts and the first to fourth base parts are formed of a metal material.

18. The light emitting device package of claim 15, wherein the first and second top parts are located at a higher position than top surfaces of the first and second light emitting devices.

19. The light emitting device package of claim 15, wherein the first and second top parts are located at a higher position than the first base part of the first lead frame and the second base part of the second lead frame.

* * * * *